(12) United States Patent
Nakamura et al.

(10) Patent No.: US 11,935,865 B2
(45) Date of Patent: Mar. 19, 2024

(54) SEMICONDUCTOR PACKAGE MANUFACTURING METHOD, AND ADHESIVE SHEET USED THEREIN

(71) Applicant: MITSUI MINING & SMELTING CO., LTD., Tokyo (JP)

(72) Inventors: Toshimi Nakamura, Ageo (JP); Tetsuro Sato, Ageo (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 314 days.

(21) Appl. No.: 17/292,178

(22) PCT Filed: Nov. 11, 2019

(86) PCT No.: PCT/JP2019/044081
§ 371 (c)(1),
(2) Date: May 7, 2021

(87) PCT Pub. No.: WO2020/105482
PCT Pub. Date: May 28, 2020

(65) Prior Publication Data
US 2021/0327848 A1 Oct. 21, 2021

(30) Foreign Application Priority Data
Nov. 21, 2018 (JP) ................... 2018-218363

(51) Int. Cl.
*H01L 21/48* (2006.01)
*H01L 23/00* (2006.01)
*H05K 3/46* (2006.01)

(52) U.S. Cl.
CPC .......... *H01L 24/81* (2013.01); *H01L 21/4857* (2013.01); *H01L 24/83* (2013.01);
(Continued)

(58) Field of Classification Search
CPC ..... H01L 24/81; H01L 21/4857; H01L 24/83; H01L 24/16; H01L 2224/16225;
(Continued)

(56) References Cited

U.S. PATENT DOCUMENTS 6,398,892 B1 * 6/2002 Noguchi ................. B24B 7/228
156/154
7,259,030 B2 * 8/2007 Daniels ................... H01L 24/29
438/455

(Continued)

FOREIGN PATENT DOCUMENTS

JP 2002-206078 A 7/2002
JP 2005-101137 A 4/2005

(Continued)

*Primary Examiner* — Vu A Vu
(74) *Attorney, Agent, or Firm* — Greenblum & Bernstein, P.L.C.

(57) ABSTRACT

A method for producing a semiconductor package, capable of effectively suppressing contamination of a chemical liquid and unintended peeling-off of a reinforcing sheet, is provided. This method includes providing a tacky sheet including a substrate sheet, and a soluble tacky layer and a banking tacky layer on at least one surface of the substrate sheet; making a first laminate including a redistribution layer; using the tacky sheet to obtain a second laminate having a second support substrate bonded to a surface on the redistribution layer side of the first laminate with the tacky layer therebetween; peeling off the first support substrate, pretreating the resulting third laminate; mounting a semiconductor chip on a pretreated surface of the redistribution layer; immersing the third laminate in a solution to dissolve or soften the tacky layer; and peeling off the second support substrate in a state where the tacky layer is dissolved or softened.

19 Claims, 3 Drawing Sheets

(52) U.S. Cl.
CPC ............ *H05K 3/4655* (2013.01); *H01L 24/16* (2013.01); *H01L 2224/16225* (2013.01); *H01L 2224/32225* (2013.01); *H01L 2224/81986* (2013.01); *H01L 2224/83986* (2013.01); *H01L 2924/37001* (2013.01)

(58) Field of Classification Search
CPC . H01L 2224/32225; H01L 2224/81986; H01L 2224/83986; H01L 2924/37001; H01L 21/568; H01L 23/49822; H01L 24/13; H01L 24/32; H01L 2221/68318; H01L 2221/68345; H01L 2221/68381; H01L 2224/13101; H01L 2224/81001; H01L 2224/81801; H01L 2224/83001; H01L 2224/83851; H01L 2924/181; H01L 21/6835; H01L 23/12; H01L 24/03; H01L 2224/0231; H01L 2224/02331; H01L 2224/02371; H05K 3/4655; H05K 1/181; H05K 3/4682; H05K 3/4661
USPC ........................................................ 438/125
See application file for complete search history.

(56) References Cited

U.S. PATENT DOCUMENTS

| | | | |
|---|---|---|---|
| 8,507,322 B2* | 8/2013 | Chida | H01L 21/78 |
| | | | 438/118 |
| 10,410,993 B2* | 9/2019 | Ko | H01L 23/3185 |
| 10,930,525 B2* | 2/2021 | Kwon | H01L 25/0655 |
| 2014/0091334 A1* | 4/2014 | Katayama | H01L 33/52 |
| | | | 438/28 |
| 2019/0292415 A1 | 9/2019 | Sato et al. | |
| 2019/0378727 A1 | 12/2019 | Matsuura et al. | |
| 2019/0378728 A1 | 12/2019 | Matsuura et al. | |

FOREIGN PATENT DOCUMENTS

| | | |
|---|---|---|
| JP | 2015-35551 A | 2/2015 |
| WO | WO2018/097264 A1 | 5/2018 |
| WO | WO2018/097265 A1 | 5/2018 |
| WO | WO2018/097266 A1 | 5/2018 |

* cited by examiner

SEMICONDUCTOR PACKAGE MANUFACTURING METHOD, AND ADHESIVE SHEET USED THEREIN

TECHNICAL FIELD

The present invention relates to a method for producing a semiconductor package and a tacky sheet to be used for the method.

BACKGROUND ART

In recent years, multilayering of a printed wiring board has widely been performed in order to increase the mounting density of the printed wiring board to reduce the size. Such a multilayer printed wiring board has been utilized in many of portable electronic devices for the purpose of reducing the weight and the size. In this multilayer printed wiring board, further reduction in thickness of an interlayer insulating layer and still further reduction in weight as a wiring board have been required.

As a technique that meets such requirements, a method for producing a multilayer printed wiring board using a coreless buildup method has been adopted. The coreless buildup method is a method in which an insulating layer and a wiring layer are alternately laminated (build up) on a so-called core (core material) by a method called a buildup method to be made into a multilayer, and the core (core material) is then removed to form a wiring board with only the buildup layers. In the coreless buildup method, using a carrier-attached copper foil in such a way that peeling-off of a support body from a multilayer printed wiring board can easily be performed has been proposed. For example, Patent Literature 1 (JP2005-101137A) discloses a method for producing a package substrate for installation to a semiconductor element, the method including: pasting an insulating resin layer to a surface of a carrier of the carrier-attached copper foil to make a support body; forming a first wiring conductor on a side of a superthin copper 30 layer of the carrier-attached copper foil by steps of photo resist processing, pattern electrodeposited copper plating, resist stripping, and the like; thereafter, forming a buildup wiring layer; and peeling off a carrier-attached support substrate to remove the superthin copper layer.

Among others, needs for high integration and reduction in thickness of semiconductor chips and printed wiring boards are increasing with still further reduction in size and power saving in electronic devices. As a next generation packaging technique that meets such needs, adoption of FO-WLP (Fan-Out Wafer Level Packaging) and PLP (Panel Level Packaging) has been studied in recent years. Adoption of the coreless buildup method has also been studied in FO-WLP and PLP. As one of such methods, there is a method called a RDL-First (Redistribution Layer-First) method, in which a wiring layer and, if necessary, a buildup wiring layer are formed on a surface of a coreless support body, further, if necessary, the support body is peeled off, and chip mounting is thereafter performed. For example, Patent Literature 2 (JP2015-35551A) discloses a method for producing a semiconductor apparatus, the method including formation of a metal release layer on a main surface of a support body composed of glass or a silicon wafer, formation of an insulating resin layer thereon, formation of a redistribution layer thereon, the redistribution layer including a buildup layer, mounting and sealing of a semiconductor integrated circuit thereon, exposure of the release layer by removal of the support body, exposure of a secondary mounting pad by removal of the release layer and formation of a solder bump on a surface of the secondary mounting pad, and secondary mounting.

With the technological trend, such that adoption of FO-WLP and PLP is studied, in recent years, reduction in thickness of the buildup layer is required. However, in the case where the thickness of the buildup layer is thin, when a substrate is peeled off from a buildup layer-attached substrate made using a coreless buildup method, the buildup layer is curved locally and largely in some cases. Such large curvature of the buildup layer causes disconnection and peeling-off of the wiring layer inside the buildup layer, which as a result can lower the connection reliability of the wiring layer. Laminating a reinforcing sheet on a multilayer laminate to improve handleability has been proposed in order to deal with such problems. For example, Patent Literature 3 (WO2018/097265) discloses reinforcing a multilayer wiring layer so as not to be curved locally and largely by laminating a reinforcing sheet on a multilayer laminate with a soluble tacky layer interposed therebetween, and it is described that the connection reliability of the multilayer wiring layer and the coplanarity of the surface of the multilayer wiring layer can thereby be improved. In addition, Patent Literature 4 (WO2018/097266) discloses a tacky sheet including a soluble tacky layer composed in an intermittent pattern having an island shape, a stripe shape, or the like. It is also disclosed in Patent Literature 4 that when such a tacky sheet is pasted to an adherend, such as a printed wiring board, to reinforce the adherend, and the tacky sheet is then peeled off, dissolution or softening of the soluble tacky layer can be facilitated by allowing a peeling solution to penetrate into a gap of the pattern of the soluble tacky layer effectively.

CITATION LIST

Patent Literature

Patent Literature 1: JP2005-101137A
Patent Literature 2: JP2015-35551A
Patent Literature 3: WO2018/097265
Patent Literature 4: WO2018/097266

SUMMARY OF INVENTION

A soluble tacky layer composed in an intermittent pattern, as disclosed in Patent Literature 4, is preferably adopted as a tacky layer for pasting a reinforcing sheet to a redistribution layer in that prompt peeling-off of the reinforcing sheet can be performed. However, when such configuration is adopted, there may occur a problem such as that a chemical liquid which is used in a step before the step of peeling off the reinforcing sheet penetrates among the patterns of the soluble tacky layer and is thereby brought into the next step, and a chemical liquid which is used in the next step is contaminated. Further, there is also a risk that the soluble tacky layer dissolves or softens due to the chemical liquid which is used in the step before the step of peeling off the reinforcing sheet and the reinforcing sheet peels off unintendedly in the middle of the production process.

The present inventors have discovered that when a second support substrate as a reinforcing sheet is pasted to a laminate including a redistribution layer on a first support substrate, the contamination of a chemical liquid which is used in a pre-treatment step or the like and the unintended peeling-off of a reinforcing sheet in production of a semiconductor package can effectively be suppressed by using a tacky sheet including a soluble tacky layer provided in an intermittent pattern and a linear banking tacky layer surrounding a periphery of the soluble tacky layer.

Accordingly, an object of the present invention is to provide a method for producing a semiconductor package, the method capable of effectively suppressing the contamination of a chemical liquid which is used in a pre-treatment step or the like, and the unintended peeling-off of a reinforcing sheet.

According to an aspect of the present invention, there is provided a method for producing a semiconductor package, the method comprising the steps of:

(a) providing a tacky sheet comprising a substrate sheet, a soluble tacky layer provided in an intermittent pattern on at least one surface of the substrate sheet, and a linear banking tacky layer surrounding a periphery of a region wherein the soluble tacky layer exists on the surface;

(b) making a first laminate comprising a redistribution layer on a first support substrate;

(c) using the tacky sheet to obtain a second laminate having a second support substrate bonded to a surface on the redistribution layer side of the first laminate with the soluble tacky layer and the banking tacky layer interposed therebetween;

(d) peeling off the first support substrate from the second laminate to obtain a third laminate wherein a surface of the redistribution layer away from the second support substrate is exposed;

(e) immersing the third laminate in a developing solution and/or a stripping solution for a dry film resist and/or in a copper sulfate plating solution to perform a pretreatment for chip mounting on the surface of the redistribution layer away from the second support substrate;

(f) mounting a semiconductor chip on the pretreated surface of the redistribution layer;

(g) immersing the third laminate mounted with the semiconductor chip in a solution to dissolve or soften only the soluble tacky layer or both of the soluble tacky layer and the banking tacky layer; and (h) peeling off the second support substrate from the third laminate in a state where only the soluble tacky layer is dissolved or softened or both of the soluble tacky layer and the banking tacky layer are dissolved or softened to obtain the semiconductor package.

According to another aspect of the present invention, there is provided a tacky sheet for use in the method, comprising: a substrate sheet; a soluble tacky layer provided in an intermittent pattern on at least one surface of the substrate sheet; and a linear banking tacky layer surrounding a periphery of a region where the soluble tacky layer exists on the surface.

DESCRIPTION OF EMBODIMENTS

A method for producing a semiconductor package according to the present invention includes steps of (a) providing a tacky sheet, (b) making a first laminate, (c) laminating a reinforcing sheet, (d) peeling off a first support substrate, (e) pre-treatment for chip mounting, (f) mounting a chip, (g) dissolving or softening a tacky layer, and (h) peeling off the reinforcing sheet.

Hereinafter, each step from the step (a) to the step (h) will be described with reference to the drawings.

(a) Providing Tacky Sheet

Figure 2A:
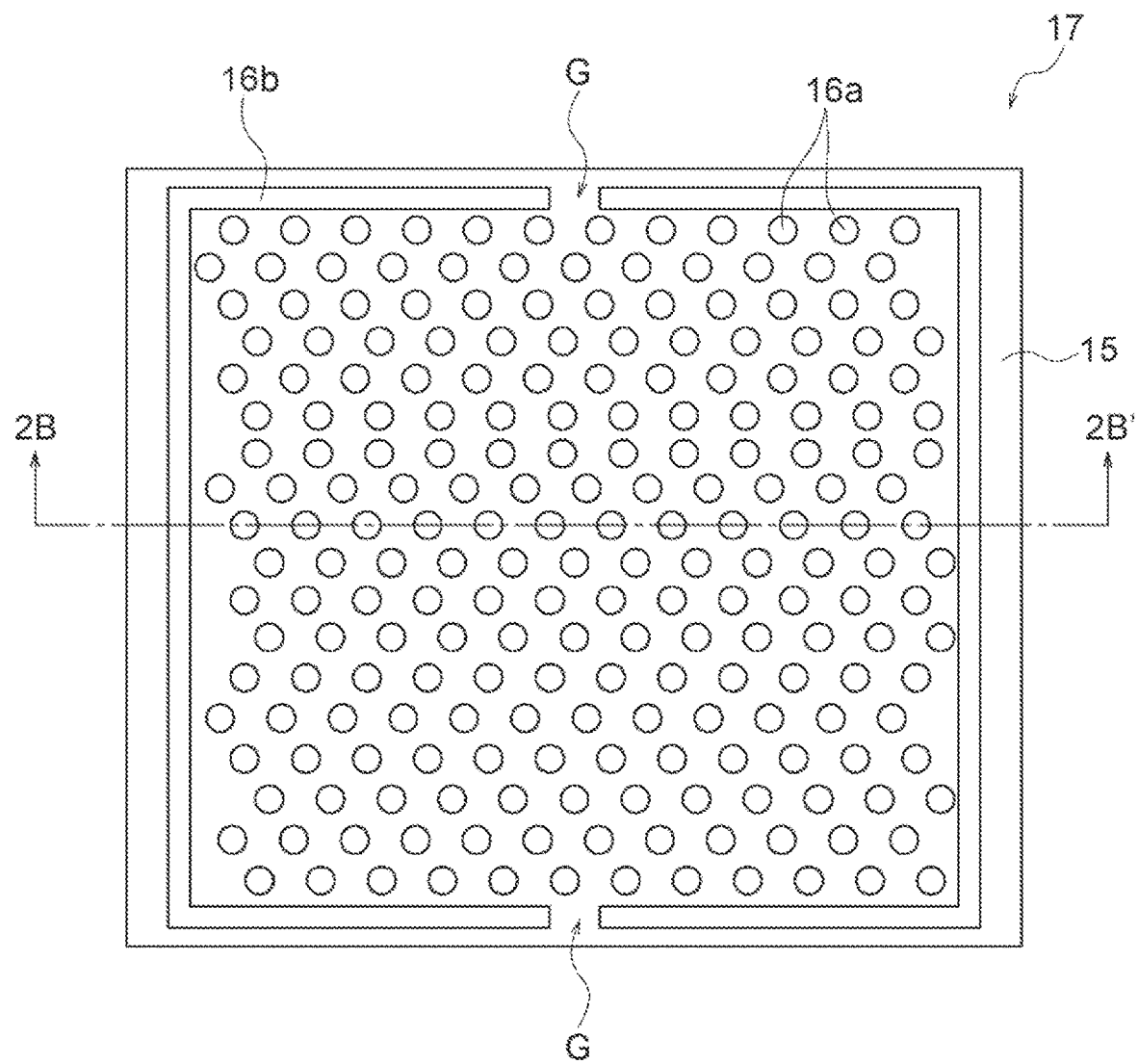
FIG. 2A is a schematic top view of one example of a tacky sheet prepared in the present invention.
Figure 2B:
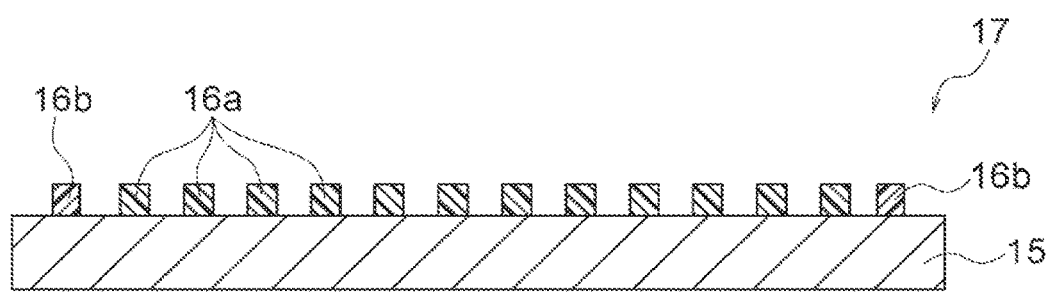
FIG. 2B is a schematic section view showing a layer composition in a section cut along line 2B-2B' of the tacky sheet shown in FIG. 2A.

As shown in FIG. 2A and FIG. 2B, a tacky sheet 17 including a substrate sheet 15, a soluble tacky layer 16a provided in an intermittent pattern on at least one surface of the substrate sheet 15, and a linear banking tacky layer 16b surrounding a periphery of a region wherein the soluble tacky layer 16a exists on the surface is provided. In the following description, the soluble tacky layer 16a and the banking tacky layer 16b are sometimes referred to as a "tacky layer 16" altogether. In addition, the details on the tacky sheet 17 will be described later. It is to be noted that there exist two types of tacky sheets; one is an "adhesion type tacky sheet" which is used for allowing the substrate sheet itself to adhere to an adherend with the tacky layer interposed therebetween, and the other is a "transfer type tacky sheet" which is used for imparting tackiness to an adherend or the second substrate sheet by transferring the tacky layer to the adherend or the second substrate sheet and peeling off the initial substrate sheet. In this respect, the tacky sheet 17 which is provided in the present invention may be any of the adhesion type tacky sheet and the transfer type tacky sheet.

(b) Making First Laminate

Figure 1A:
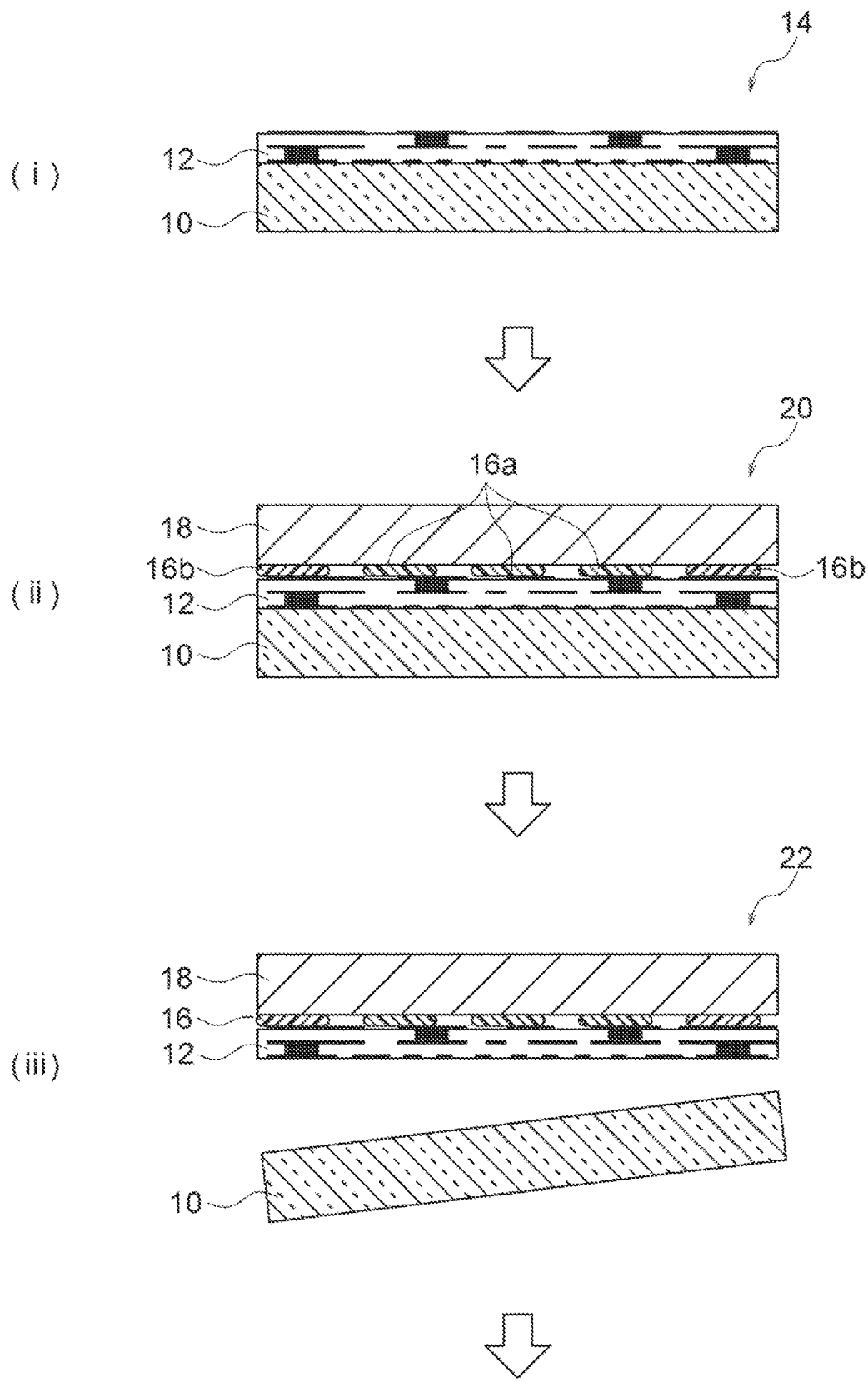
FIG. 1A is a step flow diagram showing initial steps in one example of a method for producing a semiconductor package according to the present invention.

As shown in FIG. 1A(i), a first laminate 14 including a redistribution layer 12 is made on a first support substrate 10. The first support substrate 10 is a base for forming the redistribution layer 12. The first support substrate 10 may be in the form of so-called carrier-attached metal foil, and a known layer composition is adoptable. For example, the first support substrate 10 may include a substrate, a release layer, and a metal layer in the mentioned order, and for example, a laminate sheet disclosed in Patent Literature 3 (WO2018/097265) can preferably be used (the substrate of this laminate sheet can be composed of a resin film, glass, or a ceramic). In this case, the redistribution layer 12 is preferably made on the surface of the metal layer of the first support substrate 10.

In the present invention, the redistribution layer means a layer including an insulating layer and a wiring layer formed in the inside and/or on the surface of the insulating layer. For example, a chip electrode disposed on a semiconductor chip and a terminal disposed on a printed wiring board at a larger pitch than the chip electrode can be connected electrically with this redistribution layer interposed therebetween. Forming the redistribution layer 12 may be performed according to a known method and is not particularly limited. For example, the redistribution layer 12 can be formed by alternately laminating the insulation layer and the wiring layer into a multilayer by the above-described buildup method.

(c) Laminating Reinforcing Sheet

As shown in FIG. 1A(ii), the tacky sheet 17 is used to obtain a second laminate 20 having a second support substrate 18 bonded to the surface on the redistribution layer 12 side of the first laminate 14 with the soluble tacky layer 16a and the banking tacky layer 16b interposed therebetween. For example, the second support substrate 18 is pasted to the surface on the redistribution layer 12 side of the first laminate 14 using the tacky sheet 17, and the second laminate 20 can thereby be obtained. Thereby, the redistribution layer 12 can be reinforced by the second support substrate 18 in such a way as not to be curved locally and largely. That is, the second support substrate 18 functions as a reinforcing sheet, and therefore disconnection and peeling-off of the wiring layer on the surface and/or in the inside of the redistribution layer 12 can be avoided and the connection reliability of the redistribution layer 12 can be improved. In addition, the curvature is prevented or suppressed effectively, and the coplanarity of the surface of the redistribution layer 12 can thereby be improved.

To promptly perform the step of peeling off the second support substrate 18, which will be described later, it is conceivable to adopt the soluble tacky layer 16a provided in an intermittent pattern as the tacky layer 16 which allows the second support substrate 18 to adhere to the redistribution layer 12. Thereby, a solution capable of dissolving the soluble tacky layer 16a is allowed to penetrate effectively into the gaps of the intermittent pattern, so that dissolution or softening of the soluble tacky layer 16a can be facilitated. On the other hand, when such composition is adopted, a problem attributable to a chemical liquid which is used before the step of peeling off the second support substrate 18 can occur. That is, in the production method of the present invention, a chemical liquid, such as a developing solution or a stripping solution for a dry film resist, or a copper sulfate plating solution, is used in the pre-treatment step (for example, photolithographic process) which is performed before the step of peeling off the second support substrate 18, as will be described later. Here, when the tacky layer 16 is composed of only the soluble tacky layer 16a, the chemical liquid penetrates among the patterns of the soluble tacky layer 16a and is thereby brought into the next step, and as a result, a problem that a chemical liquid which is used in a later step is contaminated can occur. Further, there is a risk that the soluble tacky layer 16a dissolves or softens due to the chemical liquid which is used in a step before the step of peeling off the second support substrate 18 and the second support substrate 18 peels off unintendedly in the middle of the production process. To deal with such problems, the tacky sheet 17 which is provided in the present invention adopts not only the soluble tacky layer 16 but also the banking tacky layer 16b as the tacky layer 16. That is, in the method of the present invention, the linear banking tacky layer 16b surrounding the periphery of a region wherein the soluble tacky layer 16a exists is present as one of the tacky layers 16 which allow the redistribution layer 12 and the second support substrate 18 to adhere to each other, and therefore the chemical liquid which is used in a step before the step of peeling off the second support substrate 18 is dammed up by the banking tacky layer 16b. Therefore, the time for the chemical liquid to reach the region wherein the soluble tacky layer 16a exists can be delayed (or the chemical liquid is not allowed to reach the region in some cases) and the penetration of the chemical liquid into the gaps of the pattern of the soluble tacky layer 16a can be prevented or suppressed. As a result, the contamination of the chemical liquid which is used in the pre-treatment step or the like and the unintended peeling-off of the second support substrate 18 which is a reinforcing sheet can effectively be suppressed.

The banking tacky layer 16b preferably lies in a region within a range of 0 mm or more and 20 mm or less from each end of the second support substrate 18, more preferably 0 mm or more and 10 mm or less, and still more preferably 0 mm or more and 2 mm or less. In addition, the banking tacky layer 16b preferably lies in a region within a range of 0 mm or more and 20 mm or less from each end of the redistribution layer 12, more preferably 10 mm or more and 20 mm or less, and still more preferably 15 mm or more and 20 mm or less. Thereby, the chemical liquid can be dammed up near each end of the redistribution layer 12 and/or the second support substrate 18, and the time for the chemical liquid to reach the region wherein the soluble tacky layer 16a exists can be delayed sill further. In addition, as will be described later, when a step of cutting off the region where the banking tacky layer 16b exists is further included, the usable region of the redistribution layer 12 can be widened to the maximum by adopting the composition.

Preferably, 50% or more and 100% or less of a region in a width direction of the banking tacky layer 16b is in contact with the redistribution layer 12 over the whole length of the banking tacky layer 16b, more preferably 70% or more and 100% or less, and still more preferably 90% or more and 100% or less. Thereby, the periphery of the region wherein the soluble tacky layer 16a exists can sufficiently been surrounded by the banking tacky layer 16b and the chemical liquid can be dammed up more effectively. It is to be noted that when the region in the width direction of the banking tacky layer 16b, the region being in contact with the redistribution layer 12, is less than 100%, a state where a part of the banking tacky layer 16b protrudes from an end of the redistribution layer 12 is supposed. In this respect, when a part in the width direction of the banking tacky layer 16b is in contact with the redistribution layer 12, the infiltration of the chemical liquid infiltrates from the part can be prevented or suppressed, and therefore such an aspect is included in the present invention.

When the tacky sheet 17 is an adhesion type tacky sheet, the substrate sheet 15 itself is preferably used as the second support substrate 18 by pasting the tacky sheet 17 to the surface on the redistribution layer 12 side of the first laminate 14. On the other hand, when the tacky sheet 17 is a transfer type tacky sheet, it is preferable that the tacky sheet 17 be pasted to the second support substrate 18 or the first laminate 14 prior to bonding of the first laminate 14 and the second support substrate 18 to transfer the tacky layer 16 to the second support substrate 18 or the first laminate 14, and the substrate sheet 15 be peeled off. The transferring method is not particularly limited, and a known method, such as, for example, roll lamination, can be adopted.

The second support substrate 18 preferably has a lower Vickers hardness than the first support substrate 10. Thereby, the second support substrate 18 itself bends, and the stress that can occur during lamination or peeling-off can thereby be released well, and as a result, the curvature of the redistribution layer 12 can effectively be prevented or suppressed. The Vickers hardness of the second support substrate 18 is preferably 2% or more and 99% or less of the Vickers hardness of the redistribution layer 12, more preferably 6% or more and 90% or less, and still more preferably 10% or more and 85% or less. The second support substrate 18 preferably has a Vickers hardness of 50 HV or more and 700 HV or less, more preferably 150 HV or more and 550 HV or less, and still more preferably 170 HV or more and 500 HV or less. It is to be noted that in the present specification, the Vickers hardness is measured in accordance with "Vickers Hardness Test" described in JIS Z 2244-2009.

For reference, examples of the Vickers hardness HV for various materials that can be a candidate are given below: sapphire glass (2300 HV), cemented carbide (1700 HV), cermet (1650 HV), quartz (rock crystal) (1103 HV), SKH56 (high-speed tool steel material, high-speed steel) (722 HV), tempered glass (640 HV), SUS440C (stainless steel) (615 HV), SUS630 (stainless steel) (375 HV), JIS type 60 titanium alloys (64 titanium) (around 280 HV), Inconel (heat-resistant nickel alloy) (150 HV or more and 280 HV or less), S45C (carbon steel for machine construction) (201 HV or more and 269 HV or less), Hastelloy alloy (corrosion-resistant nickel alloy) (100 HV or more and 230 HV or less), SUS304 (stainless steel) (187 HV), SUS430 (stainless steel) (183 HV), cast iron (160 HV or more and 180 HV or less), titanium alloy (110 HV or more and 150 HV or less), brass (80 HV or more and 150 HV or less), and bronze (50 HV or more and 100 HV or less).

The material of the second support substrate 18 is not particularly limited, but a resin, a metal, glass, or a combination thereof is preferable. Examples of the resin include an epoxy resin, a polyimide resin, a polyethylene resin, and a phenol resin, and the resin may be a prepreg composed of such a resin and a fiber-reinforced material. Examples of the metal include stainless steel and a copper alloy (for example, bronze, phosphor bronze, a copper nickel alloy, and a copper titanium alloy) from the viewpoint of the Vickers hardness and the spring deflection limit $Kb_{0.1}$, but stainless steel is particularly preferable from the viewpoint of chemical resistance. The form of the second support substrate 18 is not limited to a sheet form, and the second support substrate 18 may take another form, such as a film, a plate, and a foil, as long as the curvature of the redistribution layer 12 can be prevented or suppressed, but is preferably in the form of a sheet or a plate. The second support substrate 18 may be such that these sheet, film, plate, foil, and the like are laminated. Typical examples of the second support substrate 18 include a metal sheet, a resin sheet (a hard resin sheet in particular), and a glass sheet. The second support substrate 18 preferably has a thickness of 10 µm or more and 1 mm or less, more preferably 50 µm or more and 800 µm or less, and still more preferably 100 µm or more and 600 µm or less from the viewpoint of retention of the strength of the second support substrate 18 and easiness of handling of the second support substrate 18. When the second support substrate 18 is a metal sheet (for example, a stainless steel sheet), the surface on the side where the metal sheet adheres to the tacky layer 16 preferably has a ten-point average roughness Rz-jis (measured in accordance with JIS B 0601-2001) of 0.05 µm or more and 500 µm or less, more preferably 0.5 µm or more and 400 µm or less, and still more preferably 1 µm or more and 300 µm or less. When the metal sheet has such a surface roughness, it is considered that the adhesion of the metal sheet to the tacky layer 16 is enhanced by the anchor effect due to the unevenness of the surface and moderate peel strength in the tacky layer 16 is realized.

(d) Peeling Off First Support Substrate

As shown in FIG. 1A(iii), the first support substrate 10 is peeled off from the second laminate 20 to obtain a third laminate 22 wherein the surface of the redistribution layer 12 away from the second support substrate 18 is exposed. Thereby, for example, the substrate, the release layer, and the like composing the first support substrate 10 are peeled off and removed from the redistribution layer 12. This peeling-off/removal is preferably performed by physical peeling-off. The physical peeling-off method is a method of separation by peeling off the first support substrate 10 from the redistribution layer 12 by hand, a tool, a machine, or the like. On this occasion, when the second support substrate 18 adhering to the redistribution layer 12 with the tacky layer 16 interposed therebetween reinforces the redistribution layer 12, it can thereby be prevented that the redistribution layer 12 is curved locally and largely. That is, the second support substrate 18 reinforces the redistribution layer 12 in such a way as to resist the peeling-off force during peeling off the first support substrate 10 and can prevent or suppress the curvature still further effectively. In this way, the disconnection and peeling-off of the wiring layer in the inside and/or on the surface of the redistribution layer 12, which are caused by the curvature in some cases, can be avoided and the connection reliability of the redistribution layer 12 can be Improved. In addition, when the curvature is prevented or suppressed effectively, the coplanarity of the surface of the redistribution layer 12 can thereby be improved. It is to be noted that when the first support substrate 10 includes a metal layer, the metal layer which can be left on the surface of the third laminate 22 is preferably etched away before the pre-treatment step for chip mounting, which will be described later. Etching the metal layer may be performed based on a known method, such as flush etching.

(e) Pre-Treatment for Chip Mounting

Figure 1B:
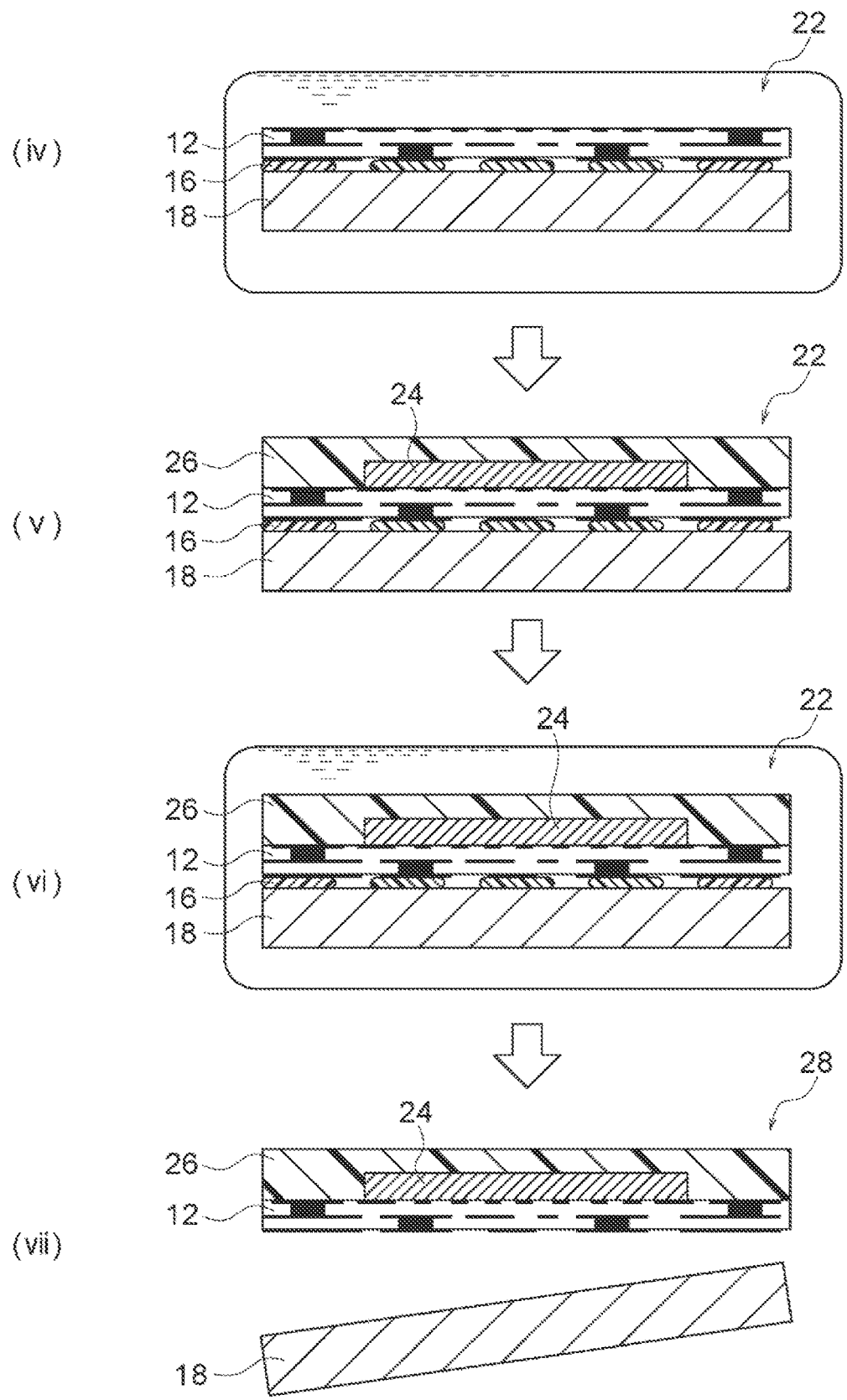
FIG. 1B is a step flow diagram showing steps following the steps shown in FIG. 1A in one example of a method for producing a semiconductor package according to the present invention.

As shown in FIG. 1B(iv), the third laminate 22 is immersed in a developing solution and/or a stripping solution for a dry film resist, and/or a copper sulfate plating solution to perform a pre-treatment for chip mounting on the surface of the redistribution layer 12 away from the second support substrate 18. This pre-treatment can be performed by, for example, the following procedure. Firstly, a dry film is pasted to the surface of the redistribution layer 12 away from the second support substrate 18, and exposure and development are performed to form a dry film resist. Then, the third laminate 22 is immersed in the copper sulfate plating solution to form electrodeposited copper plating on the surface, where the dry film resist is not formed, of the redistribution layer 12. Next, the formed dry film resist is stripped by immersing the third laminate 22 in the stripping solution. Thereby, an electrode (for example, a columnar electrode) or the like for connection with a chip electrode disposed on a semiconductor chip can be formed on the surface of the redistribution layer 12 away from the second support substrate 18. In any case, the pre-treatment of the present step may include a treatment of immersing the third laminate 22 in a developing solution and/or a stripping solution for a dry film resist, and/or a copper sulfate plating solution, and the treatment method is not particularly limited as long as the treatment method can make the surface of the redistribution layer 12 into a state where a semiconductor chip can be mounted. As the developing solution and the stripping solution for a dry film resist, a known solution which is used for developing or removing a dry film resist is adoptable. Examples of a preferred developing solution for a dry film resist include a sodium carbonate aqueous solution, and examples of a preferred stripping solution for a dry film resist include an aqueous solution of sodium hydroxide, potassium hydroxide, aminoethanol, tetramethylammonium hydroxide, or the like. In addition, the copper sulfate plating solution may be a solution containing at least copper sulfate and sulfuric acid. A known additive may be contained in the developing solution and the stripping solution for a dry film resist, and in the copper sulfate plating solution.

(f) Mounting Chip

As shown in FIG. 1B(v), a semiconductor chip 24 is mounted on the surface of the pretreated redistribution layer 12. In the production method of the present invention, the second support substrate 18 is laminated on the surface of the redistribution layer 12 with the tacky layer 16 interposed therebetween, and excellent coplanarity which is advantageous to mounting of the semiconductor chip 24 can thereby be realized on the surface of the redistribution layer 12 away from the second support substrate 18. That is, the redistribution layer 12 is not curved locally and largely by the second support substrate 18 also during mounting the semiconductor chip 24. As a result, the yield of connection of the semiconductor chip 24 can be increased.

Examples of the semiconductor chip 24 include a semiconductor element, a chip capacitor, and a resistor. Examples of the chip mounting system include a flip chip mounting system and a die bonding system. The flip chip mounting system is a system of connecting a mounting pad of the semiconductor chip 24 and a wiring layer of the redistribution layer 12. A columnar electrode (pillar), a solder bump, or the like may be formed on this mounting pad, and NCF (Non-Conductive Film) or the like, which is a sealing resin film, is pasted to the surface of the redistribution layer 12 before mounting. The connection is preferably performed using a low-melting-point metal, such as solder, but an anisotropic conductive film or the like may also be used. The die bonding adhesion system is a system of allowing the surface opposite to the surface of the mounting pad of the semiconductor chip 24 to adhere to the wiring layer. A paste or a film which is a resin composition containing a thermosetting resin and a thermally conductive inorganic filler is preferably used for this adhesion. In any of the systems, the semiconductor chip 24 is preferably sealed with a sealing material 26 as shown in FIG. 1B(v) in that the rigidity of the laminate of the redistribution layer 12 and the semiconductor chip 24 as a whole can further be improved.

(g) Dissolving or Softening Tacky Layer

As shown in FIG. 1B(vi), the third laminate 22 mounted with the semiconductor chip 24 is immersed in a solution to dissolve or soften the tacky layer 16. Dissolving or softening the tacky layer 16 may be such that only the soluble tacky layer 16a is dissolved or softened or may be such that both of the soluble tacky layer 16a and the banking tacky layer 16b are dissolved or softened. That is, the solution which is used in the present step may be a solution capable of dissolving at least the soluble tacky layer 16a (hereinafter, referred to as a dissolving solution). When the solution dissolves or softens only the soluble tacky layer 16a, a gap G, which will be described later, is preferably formed in the banking tacky layer 16b in order to secure an infiltration path of a chemical liquid. The soluble tacky layer 16a comes into contact with the dissolving solution and is dissolved or softened by immersing the third laminate 22 in the dissolving solution. On this occasion, since the soluble tacky layer 16a is composed of an intermittent pattern, the dissolving solution penetrates effectively in every corner of the soluble tacky layer 16a and dissolving or softening the soluble tacky layer 16a can be facilitated. It is considered that this is because when the third laminate 22 is immersed in the dissolving solution, the dissolving solution penetrates effectively in the gaps of the pattern of the soluble tacky layer 16a and the contact with each tacky region is facilitated. The whole of the third laminate 22 is not necessarily immersed in the solution, and a part of the third laminate 22 may be immersed in the solution. On the other hand, the present invention adopts not only the soluble tacky layer 16a but also the banking tacky layer 16b as the tacky layer 16. In this respect, the banking tacky layer 16b is preferably composed of a component which is the same as or similar to that of the soluble tacky layer 16a (a component which can be dissolved or softened with the same dissolving solution). Thereby, both of the soluble tacky layer 16a and the banking tacky layer 16b can quickly be dissolved or softened by immersing the third laminate 22 in the dissolving solution.

In addition, a step of cutting off the region where the banking tacky layer 16b exists may be added after the step (f) of mounting a chip, which is described above, and before the step (h) of peeling off the release sheet, which will be described later. Thereby, the part in the third laminate 22, the part adhering through the banking tacky layer 16b, can be removed and peeling off the second support substrate 18 from the redistribution layer 12 can easily be performed without the need for dissolving or softening the banking tacky layer 16b. In addition, when the region where the banking tacky layer 16b exists is cut off before the immersion in the dissolving solution, the dissolving solution reaches the region wherein the soluble tacky layer 16a exists without being dammed up by the banking tacky layer 16b, and therefore dissolving or softening the soluble tacky layer 16a can be performed still more quickly. Cutting off the region where the banking tacky layer 16b exists may be performed manually using a cutting tool, such as a cutter, or may be performed mechanically using a cutting machine or the like.

As the dissolving solution, a solution having a desired dissolving power may appropriately be selected according to the material of the soluble tacky layer 16a, and the dissolving solution is not particularly limited. For example, when the soluble tacky layer 16a contains an alkali-soluble resin, an alkaline solution may be used as the dissolving solution. Examples of such an alkali solution include a sodium hydroxide solution and/or a potassium hydroxide solution. These solution preferably has a concentration of 0.5% by weight or more and 50% by weight or less. When the concentration is within this range, the alkalinity is high, so that the dissolving power is improved, and sodium hydroxide and/or potassium hydroxide is difficult to deposit even when the room temperature during using the dissolving solution is low. In addition, an organic substance (for example, ethanolamine), the aqueous solution of which shows alkalinity, may be used singly or together with the solution. It is to be noted that, as will be described later, when an alkali is added to the soluble tacky layer 16a in advance, water or an aqueous solution may be used as the dissolving solution.

An organic solvent (for example, 2-propanol) capable of dissolving an acrylic resin and/or a novolak resin may be added to the alkaline solution in order to shorten the dissolution time of the soluble tacky layer 16a and/or the banking tacky layer 16b. A preferred amount of this organic solvent added is 5% by weight or more and 50% by weight or less based on 100% by weight of the alkaline solution. When the amount added is within this range, shortening of the dissolution time is desirably realized, and the amount volatilized during operation is reduced; therefore, the concentration of the alkaline substance is easily controlled and the safety is improved. A preferred organic solvent is an alcohol, and preferred examples of the alcohol include 2-propanol, methanol, ethanol, and 2-butanol.

An appropriate amount of a surfactant may be added to the alkaline solution. The penetrability and the wettability of the solution to a resin are improved by the addition of the surfactant, and therefore further shortening of the dissolution time of the soluble tacky layer 16a and/or the banking tacky layer 16b can be achieved. The type of the surfactant is not particularly limited, and any surfactant may be used. For example, as a water-soluble surfactant, any of anionic surfactants, cationic surfactants, and nonionic surfactants can be used.

(h) Peeling Off Reinforcing Sheet

As shown in FIG. 1B(vii), in a state where only the soluble tacky layer 16a or both of the soluble tacky layer 16a and the banking tacky layer 16b are dissolved or softened, the second support substrate 18 is peeled off from the third laminate 22 to obtain a semiconductor package 28. The second support substrate 18 can easily be peeled off owing to dissolution, softening, or cutting-off of the tacky layer 16. It is to be noted that with respect to the peeling-off of the second support substrate 18 from the third laminate 22, the second support substrate 18 may automatically peel off due to the dissolution or cutting-off of the tacky layer 16, or the second support substrate 18 may physically be peeled off in a state where the tack force is significantly lowered by the dissolution or softening of the tacky layer 16. In any case, the second support substrate 18 is in a state of extremely easily peeling off (or peels off naturally in some cases) due to the dissolution or softening and/or the cutting-off of the tacky layer 16, and therefore the stress which is given to the redistribution layer 12 is minimized, and the second support substrate 18 can be peeled off in an extremely short time. In this way, the stress applied to the redistribution layer 12 is minimized, and the disconnection of wiring and the disconnection of the mounted portion in the redistribution layer 12 can effectively be avoided.

Tacky Sheet

As described above with reference to FIG. 2A and FIG. 28, the tacky sheet 17 which is used in the method of the present invention includes the substrate sheet 15, the soluble tacky layer 16a provided in an intermittent pattern on at least one surface of the substrate sheet 15, and the linear banking tacky layer 16b surrounding the periphery of the region where the soluble tacky layer 16a exists on the surface. The soluble tacky layer 16a and the banking tacky layer 16b may be provided on both surfaces of the substrate sheet 15. The intermittent pattern means a shape such that the soluble tacky layer 16a exists intermittently (disconnectedly) and is formed by tacky regions wherein the soluble tacky layer 16a exists and a non-tacky region where the soluble tacky layer 16a does not exist. The intermittent pattern is preferably an island-shaped or stripe-shaped pattern, and is more preferably an island-shaped pattern. The island-shaped pattern means a shape such that each tacky region is surrounded by the non-tacky region (for example, space) existing around the tacky region. Examples of the specific shape of each tacky region composing the island-shaped pattern include various shapes, such as a polygon and a circle, and the shape of each tacky region ma by a polygon such that linear profile lines are complicated, such as a star-shaped polygon, or a heteromorphic shape such that curved profile lines are complicated.

When the soluble tacky layer 16a composes an island-shaped pattern, the circumscribed circle of each tacky region preferably has a diameter of 0.1 mm or more and 10 mm or less, more preferably 0.1 mm or more and 5.0 mm or less, and still more preferably 0.1 mm or more and 2.0 mm or less. In addition, when the soluble tacky layer 16a composes a stripe-shaped pattern, each tacky region preferably has a stripe width of 0.1 mm or more and 10 mm or less, more preferably 0.1 mm or more and 5.0 mm or less, and still more preferably 0.1 mm or more and 2.0 mm or less. When the diameter or the stripe width is within such a range, penetration of the dissolving solution into the gaps of the pattern of the soluble tacky layer 16a is facilitated and the peeling-off of the second support substrate 18 from the redistribution layer 12 by means of peeling-off by dissolution, or by other methods can be made easy even though the tack force by the soluble tacky layer 16a before the immersion into the dissolving solution is secured sufficiently. The island-shaped pattern is preferably a dot pattern, and the shape of each dot is typically a circle, but each dot may have a shape close to a circle. The dot diameter, which is defined as a dimeter of a circumscribed circle of each dot composing the dot pattern, is preferably 10 mm or less, more preferably 0.1 mm or more and 5.0 mm or less, and still more preferably 0.1 mm or more and 2.0 mm or less. Thereby, the surface area of the soluble tacky layer 16a is increased to improve the dissolvability, so that the peelability is improved.

The soluble tacky layer 16a preferably has a thickness of 0.5 μm or more and 50 μm or less, more preferably 1.0 μm or more and less than 30 μm, still more preferably 1.0 μm or more and 20 μm or less, particularly preferably 2.0 μm or more and 15 μm or less, and most preferably 3.0 μm or more and 10 μm or less. When the soluble tacky layer 16a has a thickness within the range, the dissolving solution penetrates quickly into the gaps of the pattern of the soluble tacky layer 16a, and therefore the dissolution or softening of the soluble tacky layer 16a is facilitated, and impression of the intermittent pattern to the redistribution layer 12 can be reduced. Particularly in the production of a semiconductor package, when chip mounting, solder reflow, compression molding are performed after the second support substrate 18 is pasted to the redistribution layer 12 with the tacky layer 16 interposed therebetween to reinforce the redistribution layer 12, impression attributable to the tacky layer 16 is left on the redistribution layer 12 in some cases, but when the soluble tacky layer 16a has a thickness of 7.0 μm or less, there is an advantage that the impression is unlikely to be left on the redistribution layer 12 after the compression molding. In this respect, when the soluble tacky layer 16a is formed in a dot pattern, it is particularly preferable that the dot diameter be 0.7 mm or less, and the soluble tacky layer 16a have a thickness of 1.0 μm or more and 7.0 μm or less because both of the reduction in impression and the peelability can be realized more effectively.

The intervals between the centers of the circumscribed circles in the tacky region are preferably larger than the average value of the diameters of the circumscribed circles in that sufficient gaps can be secured among the individual tacky regions. From such a viewpoint, the intervals between the centers of the circumscribed circles in the tacky region are preferably more than 0.1 mm and 20 mm or less, more preferably 0.2 mm or more and 10 mm or less, still more preferably 0.3 mm or more and 5.0 mm or less, and particularly preferably 0.4 mm or more and 2.0 mm or less. The dissolving solution penetrates quickly into the gaps of the pattern in the soluble tacky layer 16a by setting the intervals to such a range, and therefore the peelability is improved.

The island-shaped pattern may be composed of one cluster or a plurality of clusters that give a polygonal, circular, ring-shaped, band-shaped, or lattice-shaped pattern as a whole, and each of the clusters can be composed of an aggregate of three or more tacky regions.

The soluble tacky layer 16a is a layer that not only exhibits tackiness at room temperature but also can dissolve or soften by coming into contact with the dissolving solution. Accordingly, the soluble tacky layer 16a preferably contains a solution-soluble resin, and contains, for example, an acid-soluble resin or an alkali-soluble resin. This solution-soluble resin can dissolve or soften more efficiently by the contact with the dissolving solution, and therefore the peeling-off of the second support substrate 18 from the redistribution layer 12 can be performed more effectively.

A preferred solution-soluble resin is an alkali-soluble resin. The alkali-soluble resin particularly preferably contains a polymer containing at least one of a carboxyl group and a phenolic hydroxy group. Such a polymer dissolves easily in an alkaline solution in particular and therefore facilitates the dissolution of the soluble tacky layer 16a to enable the peeling-off of the second support substrate 18 from the redistribution layer 12 in a shorter time. Examples of the polymer containing at least one of a carboxyl group or a phenolic hydroxy group include an acrylic resin containing a carboxyl group and a phenol novolak resin containing a phenolic hydroxy group. An acrylic resin-based tackiness agent can be synthesized by copolymerizing an acrylic monomer (for example, acrylic acid or methacrylic acid) having a carboxyl group and having an unsaturated double bond within the molecule, and ethyl acrylate or butyl acrylate. In the synthesis, the tack force and solubility to an alkaline solution of the soluble tacky layer 16a can be controlled by adjusting the type and ratio of the acrylic monomer. In addition, the tack force and solubility to an alkaline solution of the soluble tacky layer 16a can also be controlled by adding, to the acrylic resin containing a carboxyl group, a resin (for example, epoxy resin) that causes a cross-linking reaction of the carboxyl group. That is, when part of carboxyl groups in the acrylic resin is cross-linked by a resin, such as an epoxy resin, the molecular weight thereby increases, and therefore the heat resistance is improved but the tack force is lowered, and the solubility to the alkaline solution is lowered. On the other hand, when the phenol novolak resin containing a phenolic hydroxy group is used as the alkali-soluble resin, moderate tackiness is preferably imparted by mixing a tackifier, such as rosin, because the tack force of the soluble tacky layer 16a is weak if this resin is used singly.

An alkali may be added to the alkali-soluble resin in advance. Thereby, the soluble tacky layer 16a can be dissolved or softened using water or an aqueous solution as the dissolving solution. That is, when the soluble tacky layer 16a comes into contact with water or the aqueous solution, the acidity or alkalinity of the water or the like is thereby changed into alkalinity by the alkali added in advance, and the soluble tacky layer 16a containing an alkali-soluble resin can thereby be dissolved or softened. In the production of a semiconductor package, use of a neutral or acidic solution is supposed in a rinsing step or the like, and therefore it is desired that the soluble tacky layer 16a do not dissolve inherently in the neutral or acidic solution. In this respect, the banking tacky layer 16b prevents or suppresses the contact between a chemical liquid and the soluble tacky layer 16a in the production steps effectively, and therefore an aspect wherein an alkali is added to an alkali-soluble resin in advance is allowed in the present invention.

The banking tacky layer 16b may be such that it exhibits tackiness at room temperature and can be composed using a known material appropriately. The banking tacky layer 16b may also be such that it dissolves or softens when coming into contact with the dissolving solution. In this case, the material of the banking tacky layer 16b may be selected in accordance with the soluble tacky layer 16a, and the preferred aspect of the soluble tacky layer 16a, descried above, applies to the banking tacky layer 16b without change.

The banking tacky layer 16b may also be such that a part of the banking tacky layer 16b dissolves or softens due to contact with a chemical liquid which is used in a step before the peeling-off step, but is desirably composed in such a way as not to dissolve completely toward the line width direction in order to dam up the chemical liquid surely. On the other hand, the banking tacky layer 16b, when dissolved or softened by the dissolving solution, preferably has a line width to such an extent that the banking tacky layer 16b dissolves or softens quickly due to the contact with the dissolving solution. From the viewpoint of striking a balance between these, the banking tacky layer 16b preferably has a line width of 0.5 mm or more and 10.0 mm or less, more preferably 1.0 mm or more and 5.0 mm or less, still more preferably 1.0 mm or more and 3.0 mm or less, and particularly preferably 1.0 mm or more and 2.0 mm or less. In addition, the banking tacky layer 16b preferably has a thickness of 0.5 μm or more and 50 μm or less, more preferably 1.0 μm or more and less than 30 μm, still more preferably 1.0 μm or more and 20 μm or less, particularly preferably 2.0 μm or more and 15 μm or less, and most preferably 3.0 μm or more and 10 μm or less. Particularly from the viewpoint of allowing the redistribution layer 12 and the second support substrate 18 to adhere to each other with both of the soluble tacky layer 16a and the banking tacky layer 16b interposed therebetween, the thickness of the banking tacky layer 16b is preferably matched or nearly matched (for example, within a range of ±10%) with the thickness of the soluble tacky layer 16a.

As shown in FIG. 2A, a part of the banking tacky layer 16b is preferably absent to form a gap G for degassing from the region surrounded by the banking tacky layer 16b to the outside of the region. Thereby, a gas or the like which is generated originating from the soluble tacky layer 16a can be discharged from the gap G to the outside of the banking tacky layer 16b, and unexpected peeling-off, deformation, or the like of the banking tacky layer 16b attributable to an increase in the internal pressure can thereby be prevented. Both ends of the banking tacky layer 16b, the ends dividing the banking tacky layer 16b to make the gap G, preferably have a clearance of 1 mm or more and 50 mm or less, more preferably 1 mm or more and 30 mm or less, still more preferably 1 mm or more and 10 mm or less, and particularly preferably 1 mm or more and 5 mm or less. The number of the gaps G which are formed in the banking tacky layer 16b is preferably 1 or more and 10 or less, more preferably 1 or more and 6 or less, and still more preferably 1 or more and 2 or less. Thereby, degassing to the outside of the banking tacky layer 16b and suppression of infiltration of a chemical liquid into the inside of the banking tacky layer 16b can be realized in a well-balanced manner. In addition, the redistribution layer 12 preferably has an outer peripheral length of 80% or more and 100% or less of an inner peripheral length of the banking tacky layer 16b, more preferably 85% or more and 100% or less, and still more preferably 90% or more and 100% or less. In this respect, a part of the substrate, where wiring is not formed, exists as a margin region at the periphery of the redistribution layer 12, but by adopting the composition, the banking tacky layer 16b is disposed on the surface of the part of the substrate, and as a result, the banking tacky layer 16b can be allowed to adhere to the part of the substrate near each end of the redistribution layer 12. Herein, when the gap G exists in the banking tacky layer 16$b$, the distance of the gap G (that is, the clearance of both ends of the banking tacky layer 16$b$, the ends dividing the banking tacky layer 16$b$ to make the gap) is to be included in the inner peripheral length of the banking tacky layer 16$b$. For example, with respect to the banking tacky layer 16$b$ in which 2 gaps G are formed, when the inner peripheral length of the banking tacky layer 16$b$ itself, not including the gaps G, is 2000 mm, and the distance of the gap G is 10 mm, the inner peripheral length of the banking tacky layer 16$b$ is 2020 mm (2000 mm+10 mm×2). In addition, when the ratio of the distance (mm) of the gap G to the inner peripheral length (mm) of the banking tacky layer 16$b$ is defined as a gap ratio, the gap ratio is preferably 0.3% or more and 20% or less, more preferably 0.5% or more and 12% or less, and still more preferably 0.7% or more and 7% or less from the viewpoint of realizing degassing to the outside of the banking tacky layer 16$b$ and suppression of infiltration of a chemical liquid into the inside of the banking tacky layer 16$b$ in a well-balanced manner.

The division surrounded by the banking tacky layer 16$b$ typically has a size of 10 mm or more and 600 mm or less in length and 10 mm or more and 600 mm or less in breadth. The division may be a rectangular region. The tacky sheet 17 may include the rectangular region or a plurality of the rectangular regions.

The form of the substrate sheet 15 is not limited to what is generally called a sheet, or may be another form, such as a film, a plate, and a foil. The substrate sheet 15 may be such that these sheet, film, plate, foil, and the like are laminated. In addition, a surface treatment may be performed in advance on a surface of the substrate sheet 15, on which the tacky layer 16 is to be applied, by a known method, such as a polishing treatment, an application of a mold-release agent, or a plasma treatment, in order to adjust the adhesion force between the substrate sheet 15 and the tacky layer 16.

According to a preferred aspect of the present invention, the substrate sheet 15 is preferably composed of at least one resin of polyethylene terephthalate (PET) and polyethylene (PE), and more preferably polyethylene terephthalate (PET). Particularly when the tacky sheet 17 is used as a transfer type tacky sheet, the substrate sheet 15 desirably has a function of retaining the tacky layer 16 and has a function of transferring the tacky layer 16 to the second support substrate 18 which is prepared separately, and the substrate sheet 15 of the present aspect is suitable for such a use. When the tacky sheet 17 is used as a transfer type tacky sheet, the substrate sheet 15 preferably has a thickness of 10 µm or more and 200 µm or less, more preferably 20 µm or more and 150 µm or less, and still more preferably 25 µm or more and 75 µm or less. On the other hand, when the tacky sheet 17 is used as an adhesion type tacky sheet, the substrate sheet 15 may be selected in accordance with the second support substrate 18, and the preferred aspect of the second support substrate 18, descried above, applies to the substrate sheet 15 without change. That is, when the tacky sheet 17 is used as an adhesion type tacky sheet, the function as a reinforcing sheet that improves the handleability of the redistribution layer 12 and prevents or suppresses the curvature of the redistribution layer 12 in the steps of producing a semiconductor package is desired in the substrate sheet 15 in addition to the function of retaining the tacky layer 16, and the substrate sheet 15 of the present aspect is suitable for such a use.

The invention claimed is:

1. A method for producing a semiconductor package, the method comprising:
    (a) providing a tacky sheet comprising a substrate sheet, a soluble tacky layer provided in an intermittent pattern on at least one surface of the substrate sheet, and a linear banking tacky layer surrounding a periphery of a region wherein the soluble tacky layer exists on the surface;
    (b) making a first laminate comprising a redistribution layer on a first support substrate;
    (c) using the tacky sheet to obtain a second laminate having a second support substrate bonded to a surface on the redistribution layer side of the first laminate with the soluble tacky layer and the banking tacky layer interposed therebetween;
    (d) peeling off the first support substrate from the second laminate to obtain a third laminate wherein a surface of the redistribution layer away from the second support substrate is exposed;
    (e) immersing the third laminate in a developing solution and/or immersing the third laminate in a stripping solution for a dry film resist and/or immersing the third laminate in in a copper sulfate plating solution to perform a pretreatment for chip mounting on the surface of the redistribution layer away from the second support substrate;
    (f) mounting a semiconductor chip on the pretreated surface of the redistribution layer;
    (g) immersing the third laminate mounted with the semiconductor chip in a solution to dissolve or soften only the soluble tacky layer or both of the soluble tacky layer and the banking tacky layer; and
    (h) peeling off the second support substrate from the third laminate in a state where only the soluble tacky layer is dissolved or softened or both of the soluble tacky layer and the banking tacky layer are dissolved or softened to obtain the semiconductor package.

2. The method according to claim 1, wherein the tacky sheet is an adhesion type tacky sheet, and (c) comprises pasting the tacky sheet to the surface on the redistribution layer side of the first laminate to use the substrate sheet itself as the second support substrate.

3. The method according to claim 1, wherein the tacky sheet is a transfer type tacky sheet, and (c) comprises, prior to bonding of the first laminate and the second support substrate, pasting the tacky sheet to the second support substrate or the first laminate to transfer the soluble tacky layer and the banking tacky layer to the second support substrate or the first laminate, and peeling off the substrate sheet.

4. The method according to claim 1, wherein a part of the banking tacky layer is absent to form a gap for degassing from a region surrounded by the banking tacky layer to an outside of the region.

5. The method according to claim 4, wherein both ends of the banking tacky layer, the ends dividing the banking tacky layer to make the gap, have a clearance of 1 mm or more and 50 mm or less.

6. The method according to claim 4, wherein the number of the gaps is 1 or more and 10 or less.

7. The method according to claim 1, wherein in (c), the banking tacky layer lies in a region within a range of 0 mm or more and 20 mm or less from each end of the second support substrate.

8. The method according to claim 1, wherein in (c), the banking tacky layer lies in a region within a range of 0 mm or more and 20 mm or less from each end of the redistribution layer.

9. The method according to claim 1, wherein in (c), 50% or more and 100% or less of a region in a width direction of the banking tacky layer is in contact with the redistribution layer over the whole length of the banking tacky layer.

10. The method according to claim 1, wherein the redistribution layer has an outer peripheral length of 80% or more and 100% or less of an inner peripheral length of the banking tacky layer, provided that when the gap exists, the distance of the gap is to be included in the inner peripheral length.

11. The method according to claim 1, wherein the banking tacky layer has a line width of 0.5 mm or more and 10.0 mm or less.

12. The method according to claim 1, wherein the banking tacky layer has a thickness of 0.5 µm or more and 50 µm or less, and the soluble tacky layer has a thickness of 0.5 µm or more and 50 µm or less.

13. The method according to claim 1, wherein a division surrounded by the banking tacky layer is a rectangular region having a size of 10 mm or more and 600 mm or less in length and 10 mm or more and 600 mm or less in breadth, and the tacky sheet comprises the rectangular region or a plurality of the rectangular regions.

14. The method according to claim 1, wherein the soluble tacky layer comprises a solution-soluble resin.

15. The method according to claim 14, wherein the solution-soluble resin is an alkali-soluble resin.

16. The method according to claim 1, wherein the intermittent pattern is an island-shaped or stripe-shaped pattern.

17. The method according to claim 16, wherein the island-shaped pattern is a dot pattern.

18. The method according to claim 1, further comprising cutting off a region where the banking tacky layer exists, after (f) and before (h).

19. A tacky sheet for use in the method according claim 1, comprising: a substrate sheet; a soluble tacky layer provided in an intermittent pattern on at least one surface of the substrate sheet; and a linear banking tacky layer surrounding a periphery of a region where the soluble tacky layer exists on the surface.

* * * * *